United States Patent
Johannes et al.

(10) Patent No.: US 11,031,713 B2
(45) Date of Patent: Jun. 8, 2021

(54) SPRING PROBE CONNECTOR FOR INTERFACING A PRINTED CIRCUIT BOARD WITH A BACKPLANE

(71) Applicant: SMITHS INTERCONNECT AMERICAS, INC., Kansas City, KS (US)

(72) Inventors: Richard A. Johannes, Trabuco Canyon, CA (US); Robert Meunier, Sturbridge, MA (US); Oscar Bonilla, Boston, MA (US)

(73) Assignee: SMITHS INTERCONNECT AMERICAS, INC., Kansas City, KS (US)

( * ) Notice: Subject to any disclaimer, the term of this patent is extended or adjusted under 35 U.S.C. 154(b) by 0 days.

(21) Appl. No.: 16/646,499

(22) PCT Filed: Sep. 10, 2018

(86) PCT No.: PCT/US2018/050283
§ 371 (c)(1),
(2) Date: Mar. 11, 2020

(87) PCT Pub. No.: WO2019/051421
PCT Pub. Date: Mar. 14, 2019

(65) Prior Publication Data
US 2020/0227848 A1    Jul. 16, 2020

Related U.S. Application Data

(60) Provisional application No. 62/556,918, filed on Sep. 11, 2017.

(51) Int. Cl.
*H01R 12/73* (2011.01)
*H01R 12/55* (2011.01)
(Continued)

(52) U.S. Cl.
CPC .......... *H01R 12/737* (2013.01); *H01R 12/55* (2013.01); *H01R 13/2421* (2013.01); *H01R 13/514* (2013.01)

(58) Field of Classification Search
CPC .. H01R 12/737; H01R 12/55; H01R 13/2421; H01R 13/514
(Continued)

(56) References Cited

U.S. PATENT DOCUMENTS

| 7,798,852 B2 * | 9/2010 | Laurx | H01R 13/6585 |
| | | | 439/607.08 |
| 7,914,305 B2 * | 3/2011 | Amleshi | H01R 12/737 |
| | | | 439/101 |

(Continued)

FOREIGN PATENT DOCUMENTS

JP    2010-156717    7/2010

OTHER PUBLICATIONS

International Search Report and Written Opinion of the International Searching Authority (dated Jan. 2, 2019) for Corresponding International PCT Patent Application No. PCT/US18/050283, filed Sep. 10, 2018.

*Primary Examiner* — Alexander Gilman
(74) *Attorney, Agent, or Firm* — Snell & Wilmer LLP

(57) ABSTRACT

A spring probe connector, a device and an assembly for interfacing a daughter card with a backplane. The spring probe connector includes a hollow barrel that defines a first opening and a second opening. The spring probe connector includes a plunger that is received by the first opening. The plunger includes a contact tip that protrudes from the first opening and makes electrical contact with the backplane. The spring probe connector includes one or more springs positioned within the hollow barrel and applies a load onto the plunger. The spring connector includes a contact end that (Continued)

protrudes from the second opening and connects with the printed circuit board of the modular connector assembly.

17 Claims, 13 Drawing Sheets

(51) Int. Cl.
  *H01R 13/24* (2006.01)
  *H01R 13/514* (2006.01)
(58) Field of Classification Search
  USPC .......................................................... 439/66
  See application file for complete search history.

(56) References Cited

U.S. PATENT DOCUMENTS

| | | | | |
|---|---|---|---|---|
| 7,963,806 B1* | 6/2011 | Scott Kline | .......... | H01R 13/642 439/660 |
| 8,408,946 B1* | 4/2013 | Sochor | ................ | H01R 12/714 439/700 |
| 8,547,128 B1* | 10/2013 | Sochor | ................ | G01R 1/06722 324/755.05 |
| 8,851,926 B2* | 10/2014 | Lange | ................ | H01R 13/6471 439/607.07 |
| 8,911,258 B2* | 12/2014 | Soubh | ................ | H01R 13/514 439/638 |
| 9,136,634 B2* | 9/2015 | De Geest | ............. | H01R 13/514 |
| 9,281,579 B2* | 3/2016 | Davis | ................ | H01R 12/724 |
| 9,590,333 B1* | 3/2017 | Chan | ................ | H01R 12/714 |
| 10,522,948 B2* | 12/2019 | Cho | ................ | H01R 13/6471 |
| 10,720,735 B2* | 7/2020 | Provencher | ........ | H01R 13/6598 |
| 2002/0159228 A1* | 10/2002 | Emberty | ............ | H01R 13/6205 361/679.33 |
| 2006/0073710 A1* | 4/2006 | Hwang | .............. | H01R 13/2421 439/66 |
| 2008/0139017 A1* | 6/2008 | Kiyofuji | ............ | G01R 1/07371 439/75 |
| 2009/0011664 A1* | 1/2009 | Laurx | ................. | H01R 12/724 439/884 |
| 2009/0163047 A1 | 6/2009 | Jeon | | |
| 2010/0120299 A1* | 5/2010 | Osato | ................. | H05K 7/1069 439/786 |
| 2011/0117796 A1* | 5/2011 | Oishi | ................. | H01R 13/2421 439/841 |
| 2012/0258634 A1* | 10/2012 | Morana | ................ | H01R 12/737 439/660 |
| 2014/0091824 A1* | 4/2014 | Fledell | ............... | G01R 1/06722 324/755.11 |
| 2016/0187381 A1* | 6/2016 | Jang | .................. | G01R 1/06722 324/755.05 |
| 2016/0202293 A1* | 7/2016 | Nakajima | .......... | G01R 1/07314 324/756.03 |
| 2016/0216294 A1* | 7/2016 | Kaashoek | .......... | G01R 1/06722 |
| 2016/0377486 A1* | 12/2016 | Yamashita | ............. | G01K 1/143 374/179 |
| 2017/0219623 A1* | 8/2017 | Choi | ................. | G01R 1/07314 |
| 2018/0081137 A1* | 3/2018 | Rivaud | ................ | G02B 6/4452 |
| 2020/0119481 A1* | 4/2020 | Struyk | ................ | G01R 1/06722 |
| 2020/0227848 A1* | 7/2020 | Johannes | ........... | H01R 13/2421 |

* cited by examiner

SPRING PROBE CONNECTOR FOR INTERFACING A PRINTED CIRCUIT BOARD WITH A BACKPLANE

CROSS-REFERENCE TO RELATED APPLICATIONS

This application claims priority to and the benefit of U.S. Provisional Patent Application No. 62/556,918 titled "DAUGHTER CARD," filed on Sep. 11, 2017, the entire contents of the application is hereby incorporated by reference herein for all purposes.

BACKGROUND

1. Field

This specification relates to a connector, a device and an assembly for interfacing a daughter card with a backplane.

2. Description of the Related Art

Typically, the daughter card to a backplane connection is based on a pin and a socket interface which limits the ability to maintain a controlled impedance in a ruggedized connection system. Other types of connectors to connect the daughter card to the backplane include a right angle electrical connector, a right angle daughter card receptacle, or a right angle orthogonal daughter card receptacle that may house one or more electrically conductive contacts that have a mating end to establish a conductive connection between printed circuit boards. Generally, these connectors limit conventional ruggedized systems to speeds of 16 Gb/s and are prone to speed issues. The speed issues are related to signal reflections, crosstalk, differential skew and jitter. Furthermore, these connectors do not usually allow for a modular connection to accommodate varying applications.

Accordingly, there is a need for a connector, a device and/or an assembly that eliminates the conventional pin and socket or card edge interface to provide a ruggedized system that also supports high speed signal transmission as well as a modular connection to allow flexible accommodation of varying applications.

SUMMARY

In general, one aspect of the subject matter described in this specification is embodied in a spring probe connector. The spring probe connector may connect to a backplane and a printed circuit board of a modular connector assembly. The spring probe connector may include a hollow barrel that defines a first opening (or a first cavity) and a second opening (or a second cavity). The spring probe connector may include a plunger that is received by the first opening. The plunger may include a contact tip that protrudes from the first opening and makes electrical contact with the backplane. The spring probe connector may include one or more springs positioned within the hollow barrel and applies a load onto the plunger. The spring connector may include a contact end that protrudes from the second opening and connects with the printed circuit board of the modular connector assembly.

These and other embodiments may include one or more of the following features. The plunger may retract into the hollow barrel and maintain an electrical connection with the backplane when a force is applied onto the plunger. The first opening may be positioned opposite the second opening, the first opening and the second opening being aligned along a longitudinal axis. The plunger and the contact end may extend along the longitudinal axis. The contact end may engage with an edge of the printed circuit board.

The contact end may be one or more posterior engagement arms and one or more anterior engagement arms, the one or more posterior engagement arms may engage with a posterior edge of the printed circuit board and the one or more anterior engagement arms may engage with an anterior edge of the printed circuit board. The one or more posterior engagement arms and the one or more anterior engagement arms may include inwardly facing curved portions that may contact the edge of the printed circuit board. The one or more posterior engagement arms and the one or more anterior engagement arms may be spring biased.

In another aspect, the subject matter is embodied in a spring probe connector device for a modular connector assembly that connects to a backplane. The spring probe connector device may include a carrier for providing an interface to the backplane. The carrier may hold an array of a plurality of spring probes, each spring probe of the plurality of spring probes may retract and maintain an electrical connection with the backplane when a force is applied.

In another aspect, the subject matter is embodied in a modular card assembly that interconnects with a backplane. The modular card assembly may include a spring probe connector device that has a first plurality of spring probes that each retract and maintain an electrical connection with the backplane when a force is applied. The modular card assembly may include a plurality of complaint pin clips, a second plurality of spring probes, or a solder tail. The modular card assembly may include a printed circuit board having one or more traces that connect the spring probe connector device to the plurality of spring clips, the second plurality of spring probes, or the solder tail. The plurality of spring clips, the second plurality of spring probes, and/or the solder tail may electrically connect with another printed circuit board.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

DETAILED DESCRIPTION

Figure 1A:
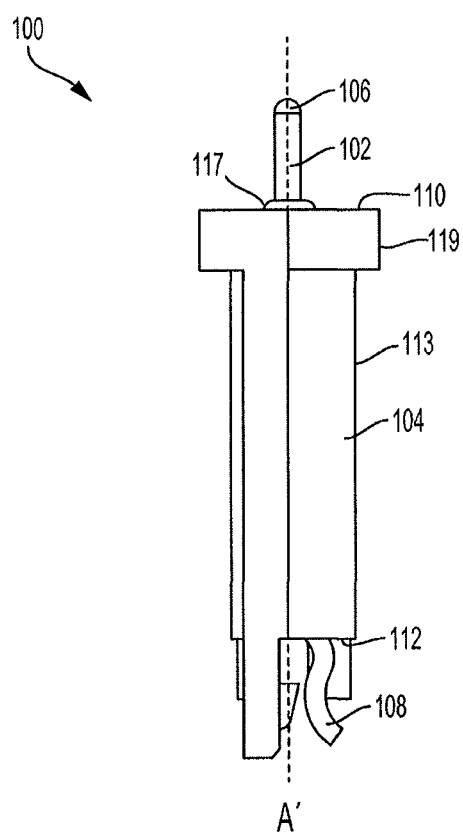
FIG. 1A shows an example of a spring probe connector according to an aspect of the invention.

Disclosed herein are systems, devices and assemblies for a spring probe connector that interconnects a daughter card with a backplane. The spring probe connector allows for a ruggedized connector that interconnects a modular connector assembly, such as a daughter card or any other printed circuit board, with the backplane. The spring probe connector may provide an interface that connects the modular connector assembly with the backplane and/or another printed circuit board (PCB), such as a motherboard. The modular connector assembly with the spring probe connector may be used in a ruggedized system for use in a military application and/or system that may encounter or be exposed to high vibration environments. Particular embodiments of the subject matter described in this specification may be implemented to realize one or more of the following advantages. The spring probe connector provides an interface that electrically connects the modular connector assembly with the backplane in a ruggedized system, such as for military, aerospace, space or other ruggedized computer/electronic control system applications. The spring probe connector is configured to withstand these high vibration environments.

Other benefits and advantages of the spring probe connector include having a flexible spring probe plunger. The spring probe connector is flexible and/or retractable while providing and maintaining an electrical connection between the backplane and an attached printed circuit board when the back plane presses against the spring probe pin or plunger. The spring probe connector is configured to electrically connect the backplane and the modular connector assembly and maintain the electrical connection, even when the backplane is mis-aligned with the modular connector assembly.

Another benefit and advantage of the spring probe connector is that the spring probe connector controls impedance across the interface with the backplane which allows the spring probe connector to support data transfer speeds between 25 Gb/s to 40 Gb/s in a ruggedized environment and eliminates the standard pin and socket interface which limits the ability to maintain a controlled impedance. This facilitates a higher level of performance for high speed signal transmission and provides flexible customization based on the particular application.

Other benefits and advantages include using the spring probe connector and vertical interconnect access (VIA) to connect one or more traces of a printed circuit board. The use of a spring probe and VIA to connect the traces costs less than the pin and socket design and is more robust when a connected printed circuit board moves relative to the backplane. A typical pin and socket design may over-deflect or otherwise be bent when the connected printed circuit board moves. The typical design has a thermal or "wedge-lock" card guide, which indexes the daughter card sideways to ensure solid contact between the daughter card's supporting heat sink and the frame of the electronics unit. This indexing or lateral displacement is difficult with the pin engaged in a mating socket contact in the connector. Spring probes, however, simply slide laterally on the target contact's surface to ensure contact.

Finally, the spring probe connector eliminates the backplane connector side component and allows use of a blind VIA on a thicker backplane printed circuit board. The replacement of the existing plated through holes with a blind VIA reduces the capacitance and aids in maintaining an approximate 100 ohm impedance. The VIA also allows for controlled impedance and trace routing in the backplane with fewer layers and lower cost.

Conventional pin and socket interfaces typically use one or more pins of 0.015 inches (0.38 mm) in diameter with an unsupported length of 0.25 inches (6 mm) minimum. This is compared to an exposed "plunger" of the same diameter, unsupported for <0.1 inches (2.5 mm) length.

FIG. 1A shows a spring probe connector ("spring probe") 100. The spring probe 100 may electrically connect to a backplane and a printed circuit board of a modular connector assembly. The spring probe 100 may include a spring probe plunger ("plunger") 102, a hollow barrel 104, and a printed circuit board (PCB) contact end ("contact end") 108.

An electrical signal may be first received from a backplane by the plunger 102 and transmitted to the hollow barrel 104 via the electrical connection between the plunger 102 and the hollow barrel 104. The electrical signal may then be received by the contact end 108 via the electrical connection between the hollow barrel 108 and the contact end 108. The electrical signal may then be received by a printed circuit board of a modular connector assembly from the contact end 108 via the electrical connection between the contact end 108 and the printed circuit board.

Similarly, an electrical signal may be first received from a printed circuit board of a modular connector assembly by the contact end 108 and transmitted to the hollow barrel 104 via an electrical connection between the contact end 108 and the hollow barrel 104. The electrical signal may then be received by the plunger 102 via the electrical connection between the plunger 102 and the hollow barrel 104. The electrical signal may then be received by a backplane from the plunger 102 via the electrical connection between the plunger 102 and the backplane.

The spring probe 100 may include a hollow barrel 104 that defines a first opening 110 and a second opening 112. The first opening 110 and the second opening 112 may be aligned along a longitudinal axis A'. In some embodiments, the first opening 110 may be positioned opposite the second opening 112. The hollow barrel 104 may be manufactured from liquid crystal polymer (LCP). The hollow barrel 104 is depicted as having a circular cross section. However, other cross sectional configurations may be used interchangeably according to various embodiments. The hollow barrel 104 may have an outer surface 113 and an inner surface 115

Figure 1B:
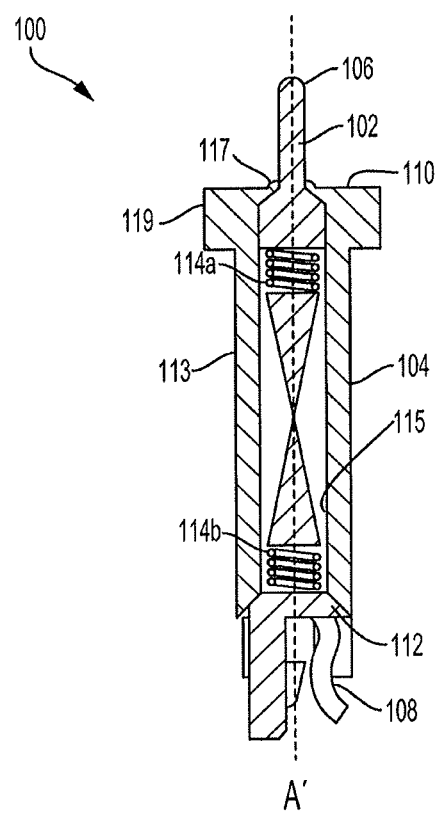
FIG. 1B shows a cross-sectional side perspective view of the spring probe connector of FIG. 1A according to an aspect of the invention.

(shown in FIG. 1B). In some embodiments, at least some of the inner surface 115 may be electrically conductive.

Figure 3A:
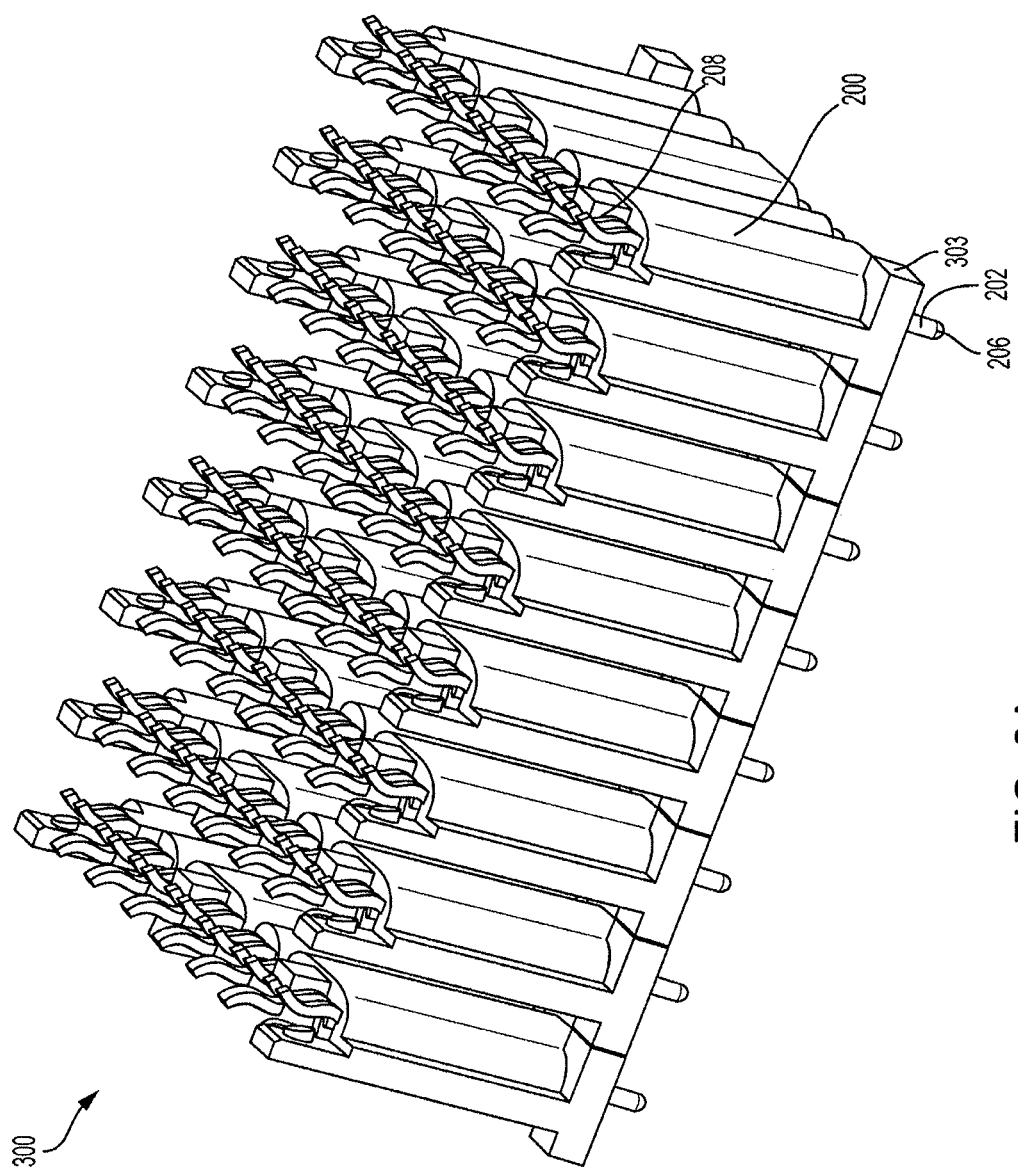
FIG. 3A shows an example spring probe connector device having multiple spring probe connectors, including the spring probe connector of FIGS. 2A-2B, housed in a carrier according to an aspect of the invention.
Figure 3B:
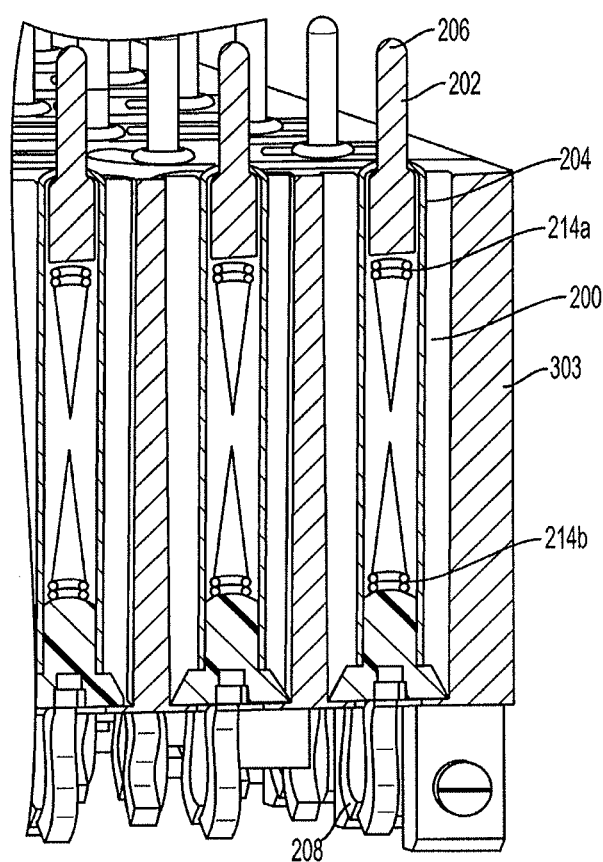
FIG. 3B shows a cross-sectional view of the spring probe connector device of FIG. 3A according to an aspect of the invention.
Figure 3C:
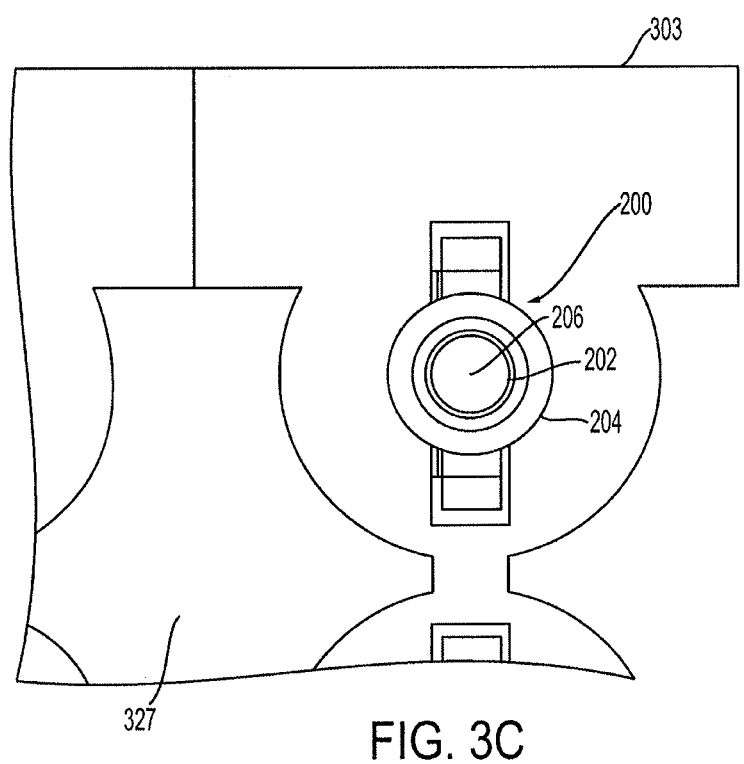
FIG. 3C shows a close-up top perspective view of the spring probe connector of FIGS. 2A-2B and 3A-3B according to an aspect of the invention.

The hollow barrel 104 may include a shoulder or flange 119 to prevent setback of the spring probe 100 when the spring probe 100 is placed in a carrier 303 (shown in FIGS. 3A-3C). However, other configurations to prevent setback of the spring probe 100 may be used interchangeably according to various embodiments.

The spring probe 100 may include a plunger 102 that is configured to be received by the first opening 110 of the hollow barrel 104. The plunger 102 may be at least in partial contact with the inner surface 115 of the hollow barrel 104. For example, the plunger 102 may be slideably engaged with the inner surface 115 of the hollow barrel 104. The plunger 102 may have a contact tip 106 that protrudes from the first opening 110. The contact tip 106 may be configured to make electrical contact with a backplane. The plunger 102 may be manufactured from a copper alloy. For example, the plunger 102 may be manufactured from a beryllium copper and/or phosphorous bronze alloy. In some embodiments, at least a portion of the plunger 102 may be coated with a conductive substance. For example, the plunger 102 may be coated with an alloy containing copper, nickel, and gold. The plunger 102 is depicted as having a circular cross section. However, other cross sectional configurations may be used interchangeably according to various embodiments.

A crimp 117 in the hollow barrel 104 may be included to retain the plunger 102 within the hollow barrel 104. However, other configurations to retain a plunger 102 may be used interchangeably according to various embodiments.

The spring probe 100 may include one or more springs 114a and 114b (marked in FIG. 1B) positioned within the hollow barrel 104. The one or more springs 114a and 114b may be configured to apply a spring load ("load") onto the plunger 102 along the longitudinal axis A'. The plunger 102 may be configured to retract into the hollow barrel 104 and maintain an electrical connection with the backplane when a force is applied onto the plunger 102. The force applied onto the contact tip 106 and/or the plunger 102 may at least be partially aligned along the longitudinal axis A' and opposite the load applied by the one or more springs 114a and 114b.

The one or more springs 114a and 114b retract and/or compress inward into the hollow barrel 104 when a force is applied to the contact tip 106 and/or the plunger 102 which causes the plunger 102 to retract into the hollow barrel 104. The force may be caused, for example, by the upward-downward and/or sideward motion when an attached or connected printed circuit board is slid into a backplane.

The spring probe 100 may include a contact end 108 that protrudes from the second opening 112 of the hollow barrel 104. The contact end 108 may be configured to connect with an edge of a printed circuit board 405 (shown in FIG. 4) of a modular connector assembly. In some embodiments, the contact end 108 may be spring biased so as to more tightly connect with the edge of the printed circuit board 405.

The contact end 108 may be configured to contain the one or more springs 114a and 114b within the hollow barrel 104. The contact end 108 may be manufactured from a copper alloy. For example, the contact end 108 may be manufactured from a beryllium copper and/or phosphorous bronze alloy. In some embodiments, at least a portion of the contact end 108 may be coated with a conductive substance. For example, the contact end 108 may be coated with an alloy containing copper, nickel, and gold. The contact end 108 and the plunger 102 may extend along the longitudinal axis A'.

The features of the spring probe 100 may be utilized with any embodiment of spring probe disclosed herein.

Figure 2A:
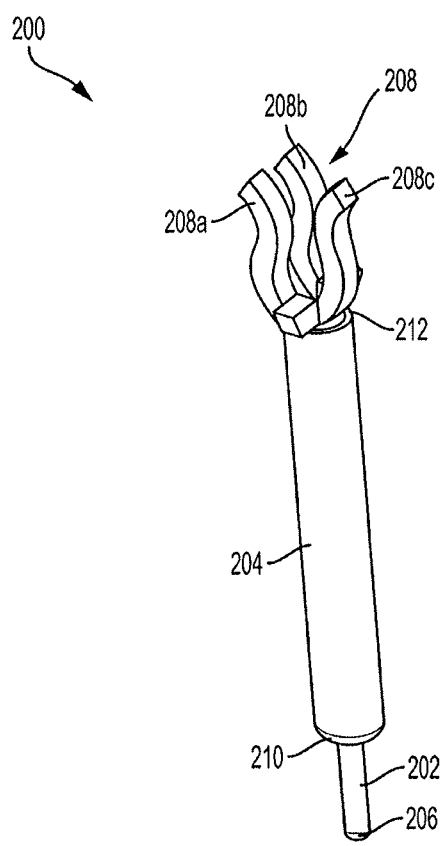
FIG. 2A shows an example of a spring probe connector according to an aspect of the invention.

FIG. 2A shows an embodiment of a spring probe connector ("spring probe") 200. The spring probe 200 may connect to a backplane and a printed circuit board of a modular connector assembly. The spring probe 200 may include a spring probe plunger ("plunger") 202, a hollow barrel 204, and a contact end 208.

The plunger 202 may be configured similarly as the plunger 102 discussed in regard to FIGS. 1A-1B and may include similar features as the plunger 102 discussed in regard to FIGS. 1A-1B. The contact tip 206 may be configured similarly as the contact tip 106 discussed in regard to FIGS. 1A-1B and may include similar features as the contact tip 106 discussed in regard to FIGS. 1A-1B. The hollow barrel 204 may be configured similarly as the hollow barrel 104 discussed in regard to FIGS. 1A-1B and may include similar features as the hollow barrel 104 discussed in regard to FIGS. 1A-1B. The spring probe 200 may include one or more springs 214a and 214b (shown in FIG. 3B) that are configured similarly as the one or more springs 114a and 114b discussed in regard to FIGS. 1A-1B and may include similar features as the one or more springs 114a and 114b discussed in regard to FIGS. 1A-1B. The contact end 208 may be configured similarly as the contact end 108 discussed in regard to FIGS. 1A-1B and may include similar features as the contact end 108 discussed in regard to FIGS. 1A-1B.

Figure 2B:
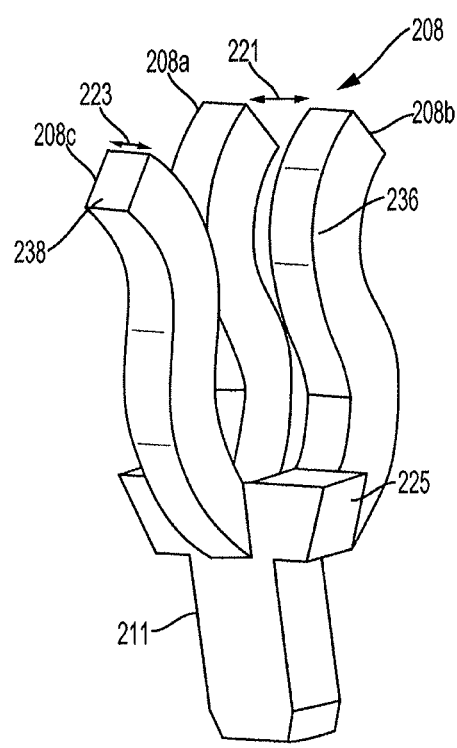
FIG. 2B shows an example printed circuit board (PCB) contact end of the spring probe connector of FIG. 2A according to an aspect of the invention.

FIGS. 2A-2B depict the contact end 208 having three engagement arms (208a, 208b, and 208c), however any number of engagement arms may be used interchangeably according to various embodiments. The engagement arms 208a, 208b, and 208c may be configured to engage with different sides of an edge of a printed circuit board 405 (shown in FIG. 4) of a modular connector assembly. The printed circuit board 405 may have a posterior side and an interior side. That is, the printed circuit board 405 may be double sided.

The engagement arms 208a and 208b may be posterior engagement arms that may engage with a posterior edge 407 of the printed circuit board 405 (shown in FIG. 4) of a modular connector assembly. The engagement arm 208c may be an anterior engagement arm that may engage with an anterior edge 409 of the printed circuit board 405 (marked in FIG. 4) of a modular connector assembly.

The contact end 208 may have a central portion 211 (shown in FIG. 2B). In some embodiments, the engagement arms 208a, 208b, and 208c may connect to each other via the central portion 211. The central portion 211 may extend within the hollow barrel 204 and may be in electrical contact with the inner surface of the hollow barrel 204, such as the inner surface 115 depicted in FIGS. 1A-1B.

Figure 4:
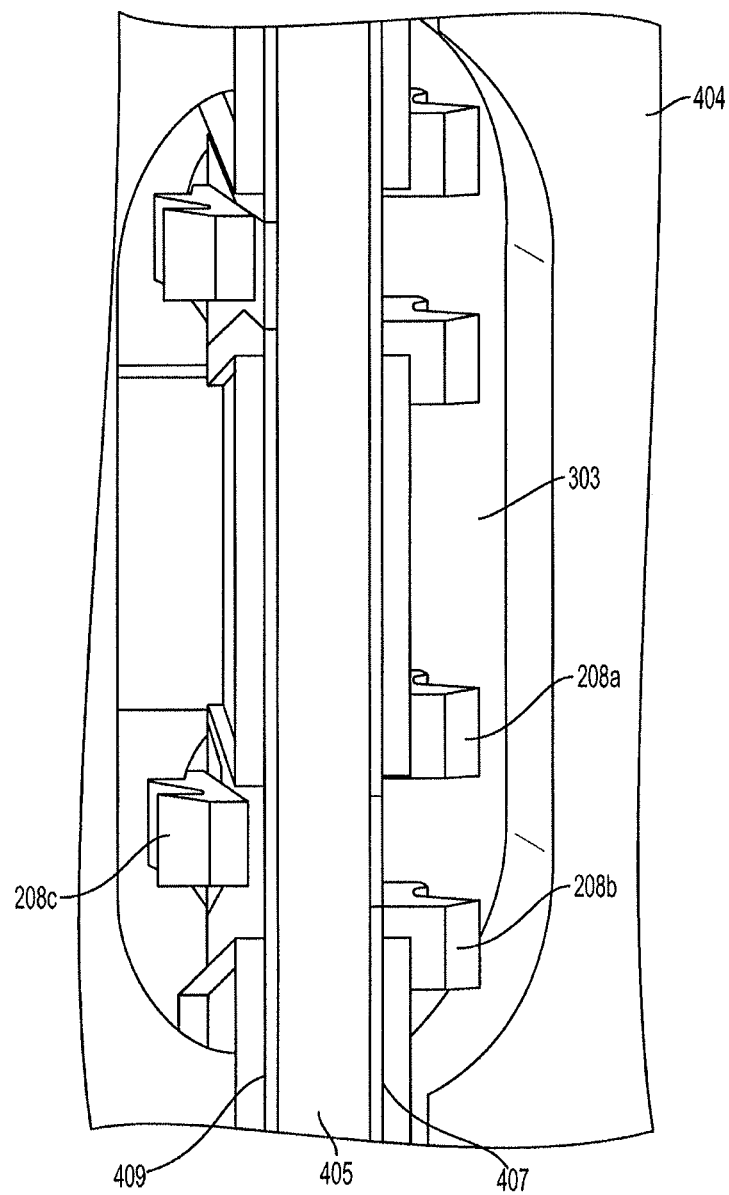
FIG. 4 shows a close-up view of the interface between the spring probe connector of FIGS. 2A-2B and 3A-3B engaged with a printed circuit board according to an aspect of the invention.

As depicted in FIGS. 2A-2B, the engagement arms 208a, 208b, and 208c may include inwardly facing curved portions 236 that contact the edge of the printed circuit board 405 (shown in FIG. 4). However, the engagement arms may be straight ("slotted") according to various embodiments. For example, the engagement arms may be slotted to form a U-shaped channel. In other embodiments, the engagement arms may be duckbill shaped.

As depicted in FIGS. 2A-2B, the engagement arms 208a, 208b, and 208c may also include outwardly facing curved portions 238. The outwardly facing curved portions 238 may assist a user in aligning the spring probe 200 with the edge of the printed circuit board 405 of a modular connector assembly. In some embodiments, at least one of the engagement arms 208a, 208b, and 208c may be spring biased.

The posterior engagement arms 208a and 208b may be spaced from each other by a distance 221. In order to provide a clearance for the anterior engagement arm 208c, the distance 221 may have a width that is as wide as or wider than the width 223 of the anterior engagement arm 208c. In some embodiments, the posterior engagement arms 208a and 208b may be separated from the anterior engagement arm 208c by a resting distance. The resting distance may be as wide as or wider than the width of the edge of the printed circuit board 405 (shown in FIG. 4).

In other embodiments, when the engagement arms 208a, 208b, and 208c are spring biased, the resting distance may be thinner than the width of the edge of the printed circuit board 405. For example, the engagement arms 208a, 208b, and 208c may move away from the resting position when the engagement arms 208a, 208b, and 208c engage the edge of the printed circuit board 405 so as to more tightly connect with the edge of the printed circuit board 405.

In some embodiments, the posterior engagement arms 208a and 208b may be as wide as the width 223 of the anterior engagement arm 208c. In other embodiments, the posterior engagement arms 208a and 208b may be thinner than the width 223 of the anterior engagement arm 208c in order to occupy less space.

The contact end 208 may include a shoulder or flange 225 to prevent setback of the contact end 208 when the spring probe 200 is placed in a carrier 303 (marked in FIGS. 3A-3C). However, other configurations to prevent setback of the spring probe 200 may be used interchangeably according to various embodiments.

The features of the spring probe 200 may be utilized with any embodiment of spring probe disclosed herein.

FIGS. 3A-3C show a spring probe connector device ("connector device") 300 for a modular connector assembly that connects to a backplane. The connector device 300 includes a carrier 303 and a plurality of spring probes including spring probe 200 from FIGS. 2A-2B.

The carrier 303 may have the plurality of spring probes arranged in an array or a matrix. The carrier 303 may provide an interface to connect multiple printed circuit boards with a backplane. The carrier 303 may hold multiple spring probes that may be aligned in an array that has one or more rows and/or one or more columns. Each column of one or more rows of the spring probes interface with an edge of a single printed circuit board. Thus, the spring probe connector device 300, using one or more spring probes, may have multiple columns of one or more rows of spring probes that connect with multiple printed circuit boards to provide an interface with the backplane.

In some embodiments the carrier 303 may be manufactured from an insulating plastic. For example, the carrier 303 may be manufactured from a liquid crystal polymer (LCP) and may have a dielectric constant supporting an impedance. In some embodiments, the carrier 303 may have air or one or more air gaps 327 within. The one or more air gaps 327 may advantageously allow air to circulate between the one or more spring probes to help mitigate overheating.

The features of the spring probe connector device 300 may be utilized with any embodiment of spring probe connector device disclosed herein.

FIG. 4 shows a close-up view of the interface between the spring probe 200 and the printed circuit board 405. As depicted, the posterior engagement arms 208a and 208b engage the posterior edge 407 of the printed circuit board 405 and the anterior engagement arm 208c engages the anterior edge 409 of the printed circuit board 405. In some embodiments, one or more contact pads on the printed circuit board 405 may be contact with the engagement arms 208a, 208b, and 208c. For example, the anterior engagement arm 208c may engage with a contact pad on the anterior edge 409 of the printed circuit board 405. A conductive plastic 404 that is part of the printed circuit board 405 may surround and enclose the interface between the spring probe 200 and the printed circuit board 405.

Figure 5:
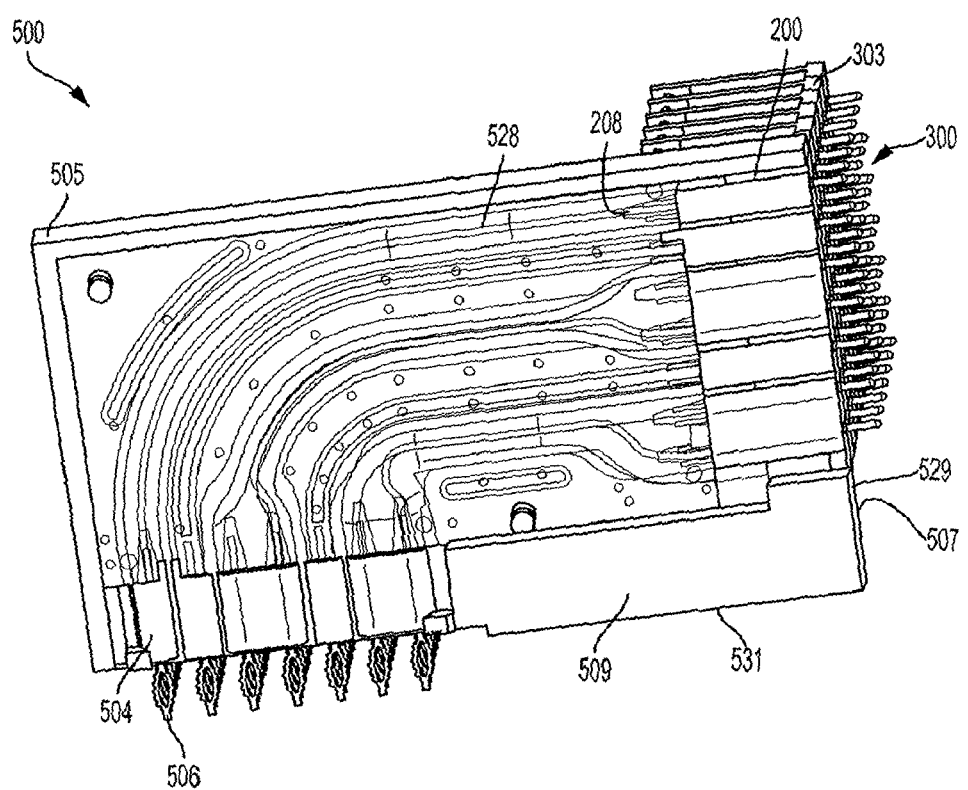
FIG. 5 shows a modular connector assembly with the spring probe connector device of FIGS. 3A-3C interconnected with a printed circuit board according to an aspect of the invention.

FIG. 5 shows an example of a modular connector assembly 500, such as a high-speed daughter card or other printed circuit board, that interfaces with a backplane.

The modular connector assembly 500 includes the spring probe connector device 300 from FIGS. 3A-3C, a printed circuit board 505, and a plurality of compliant pin clips 506. The printed circuit board 505 may be configured similarly as the printed circuit board 405 of FIG. 4 and may include similar features as the printed circuit board 405 of FIG. 4.

The modular connector assembly 500 interfaces with a backplane using the spring probe connector device 300 that has a plurality of spring probes including spring probe 200. The modular connector assembly 500 may include a plastic holder 504 and one or more compliant pin clips 506.

The printed circuit board 505 interfaces with the spring probe connector device 300 along a first edge 529 to connect the printed circuit board 505 to a backplane. One or more printed circuit boards may be received by the contact ends, such as contact end 208, of the plurality of spring probes within the spring probe connector device 300. The plurality of spring probes of the spring probe connector device 300 deflect and make contact with the backplane when the printed circuit board 505 is pushed into a card slot within the backplane. This advantageously allows the modular connector assembly 800 to maintain an electrical connection with the backplane even though one or more connectors on the backplane may be misaligned with the modular connector assembly 300.

The printed circuit board 505 may interface with a plastic holder 504 along a second edge 531 of the printed circuit board 505. The second edge 531 may be at a right angle to the first edge 529. The plastic holder 504 may receive one or more compliant pin clips 506, e.g., an eye of the needle press-fit compliant pin. The eye of the needle press-fit compliant pin may collapse when pushed or moved into a printed circuit board hole to connect to a backplane or other printed circuit board. In some embodiments, the plastic holder 504 may be another plastic carrier. The plastic holder 504 may hold one or more spring probes, instead of the one or more compliant pin clips 506, to provide an interface between the printed circuit board 505 and the backplane or other printed circuit board. In some embodiments, the printed circuit board 505 may interface using a solder tail or other PCB interface to the backplane. In other embodiments, the compliant pin clips 506, one or more spring probes, and/or a solder tail may be directly attached to the printed circuit board 505.

The printed circuit board 505 may have a posterior side 507 and an anterior side 509. That is, the printed circuit board 505 may be a double-sided printed circuit board that has one or more traces or transmission lines ("traces") 528 that run on the posterior side 507, the anterior side 509 or both sides. The posterior side 507 may be opposite the anterior side 509 on a double-sided printed circuit board.

The one or more traces 528 provide a signal path from the one or more contact ends, such as the contact end 208, of the one or more spring probes, such as 200, to the one or more compliant pin clips 506. Each contact end may connect to a corresponding compliant pin clip 506 via a trace 528. On a double-sided printed circuit board, a trace on the posterior side 507 of the printed circuit board has a corresponding trace on the anterior side 509 of the printed circuit board so that the distance and time the signal takes to travel back and forth along the posterior side 507 and the anterior side 509 side is the same. By sending the signal on a posterior trace on the posterior side 507 and returning the signal on an anterior trace on the anterior side 509, the electromagnetic energy that is radiated may be minimized.

In other embodiments, a trace on the anterior side 509 of the printed circuit board has a corresponding trace on the posterior side 507 of the printed circuit board so that the distance and time the signal takes to travel back and forth along the anterior side 509 and the posterior side 507 is the same. By sending the signal on an anterior trace on the anterior side 509 and returning the signal on a posterior trace on the posterior side 507, the electromagnetic energy that is radiated may be minimized.

The features of the modular connector assembly 500 may be utilized with any embodiment of modular connector assembly disclosed herein.

Figure 6A:
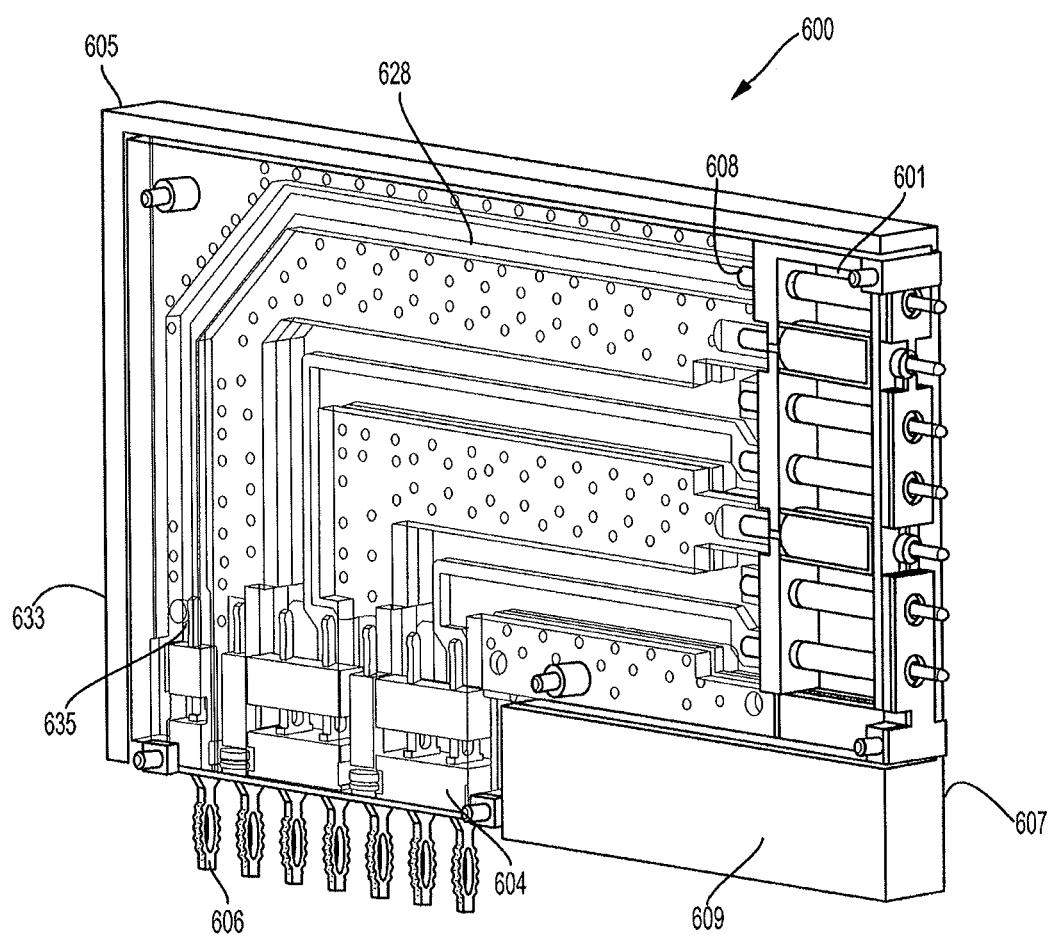
FIG. 6A shows a modular connector assembly interconnected with a printed circuit board according to an aspect of the invention.
Figure 6B:
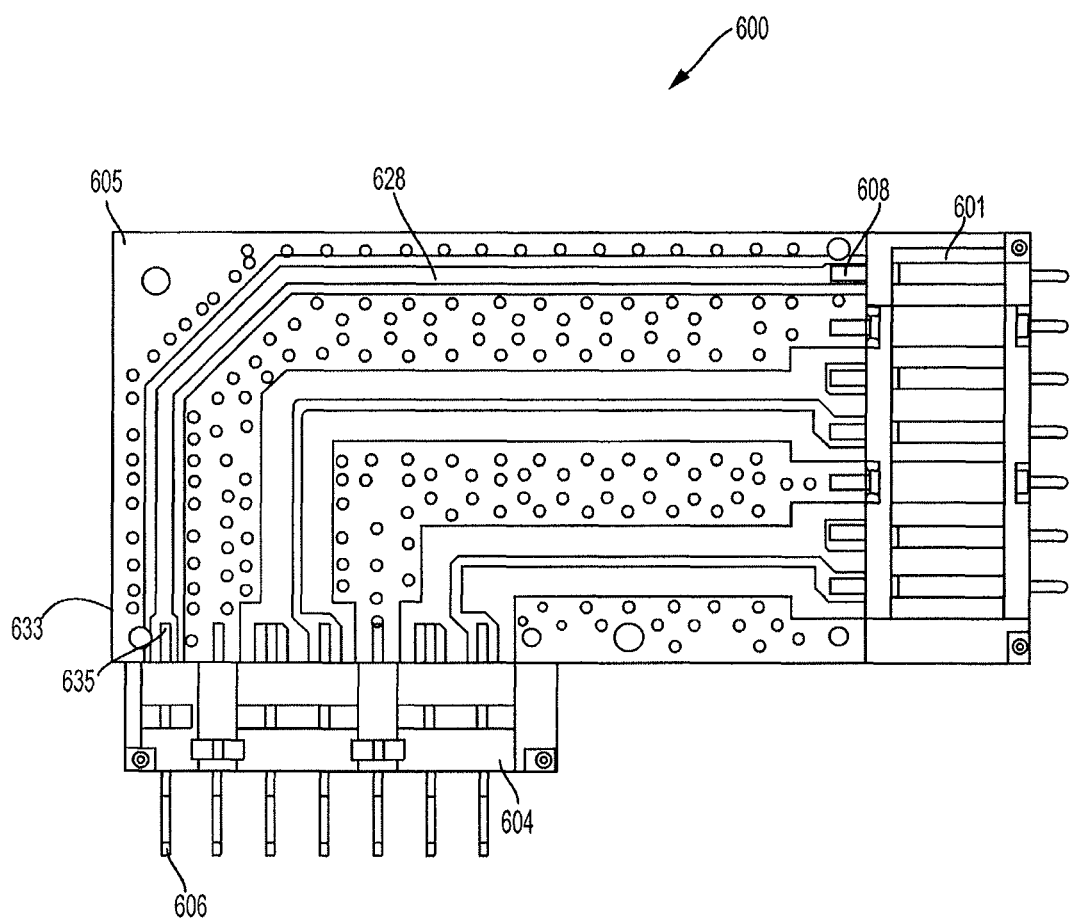
FIG. 6B shows a side perspective view of the modular connector assembly of FIG. 6A according to an aspect of the invention.
Figure 6C:
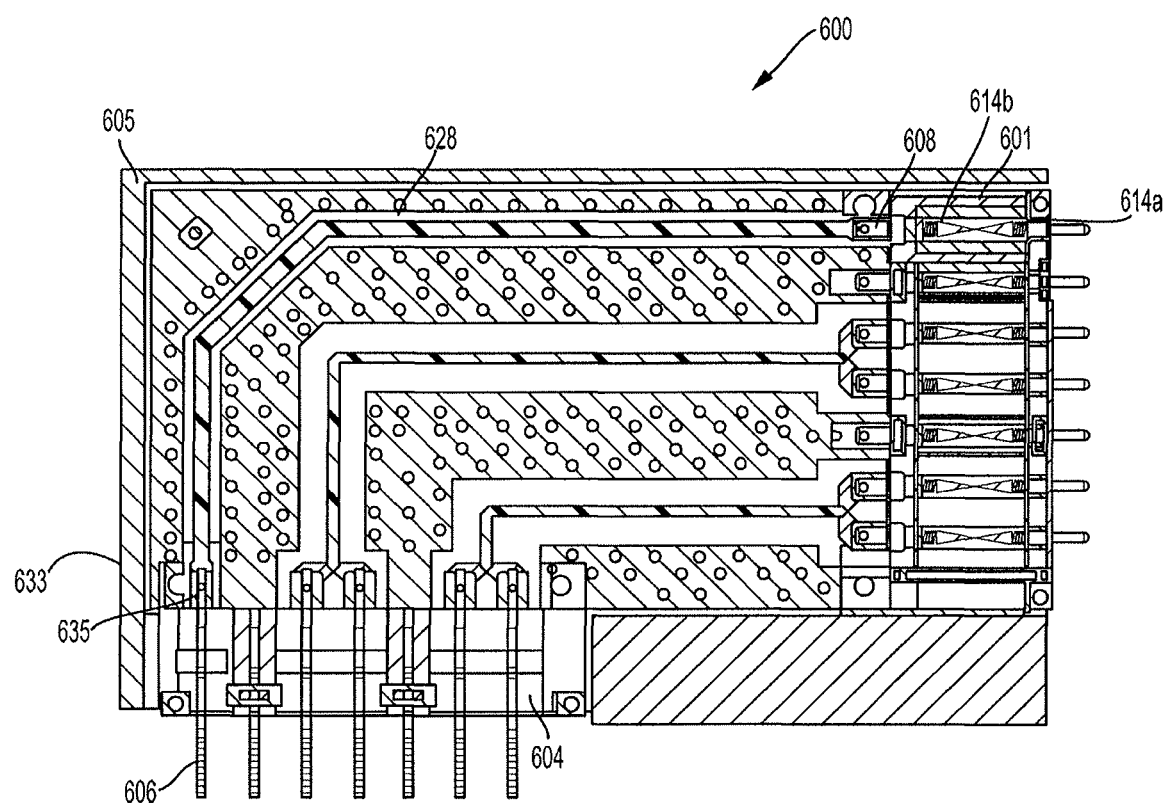
FIG. 6C shows a cross-sectional side perspective view of the modular connector assembly of FIGS. 6A-6B according to an aspect of the invention.

FIGS. 6A-6C shows an example of a modular connector assembly 600, such as a high-speed daughter card or other printed circuit board, that interfaces with a backplane.

The modular connector assembly 600 includes a printed circuit board 605, a plurality of spring probe connectors 601, and a plurality of compliant pin clips 606. The printed circuit board 605 may be configured similarly as printed circuit boards 405 and 505 discussed in regard to FIGS. 4 and 5 and may include similar features as the printed circuit boards 405 and 505 discussed in regard to FIGS. 4 and 5. The plurality of spring probe connectors 601 may be configured similarly as the spring probe connectors 100 and 200 discussed in regard to FIGS. 1A-1B, 2A-2B, 3A-3C, 4, and 5 and may include similar features as the spring probe connectors 100 and 200 discussed in regard to FIGS. 1A-1B, 2A-2B, 3A-3C, 4, and 5.

The one or more springs 614a and 614b may be configured similarly as the one or more springs 114a, 114b, 214a, and 214b discussed in regard to FIGS. 1A-1B, 2A-2B, and 3A-3C and may include similar features as the one or more springs 114a, 114b, 214a, and 214b discussed in regard to FIGS. 1A-1B, 2A-2B, and 3A-3C. The plurality of compliant pin clips 606 may be configured similarly as the plurality of complaint pin clips 506 discussed in regard to FIG. 5 and may include similar features as the plurality of complaint pin clips 506 discussed in regard to FIG. 5.

As depicted, the contact ends 608 form a U-shaped channel to receive the printed circuit board 605. In some embodiments the contact ends 608 may be permanently attached to the printed circuit board 605. In other embodiments, the contact ends 608 may be removably attached to the printed circuit board 605.

The plurality of compliant pin clips 606 have a forked interface that includes a posterior fork arm 633 and an anterior fork arm 635. The posterior fork arm 633 may engage with the posterior side 607 of the printed circuit board 605 of the modular connector assembly 600. The anterior fork arm 635 may engage with the anterior side 609 of the printed circuit board 605 of the modular connector assembly 600. In some embodiments, the plastic holder 604 may pinch the posterior fork arm 633 and the anterior fork arm 635 to engage the printed circuit board 605. In other embodiments, the compliant pin clips 606 may engage with a slot attached to the printed circuit board 605. For example, the posterior fork arm 633 and the anterior fork arm 635 may engage with an inner surface of the slot attached to the printed circuit board 605.

The features of the modular connector assembly 600 may be utilized with any embodiment of modular connector assembly disclosed herein.

Figure 7:
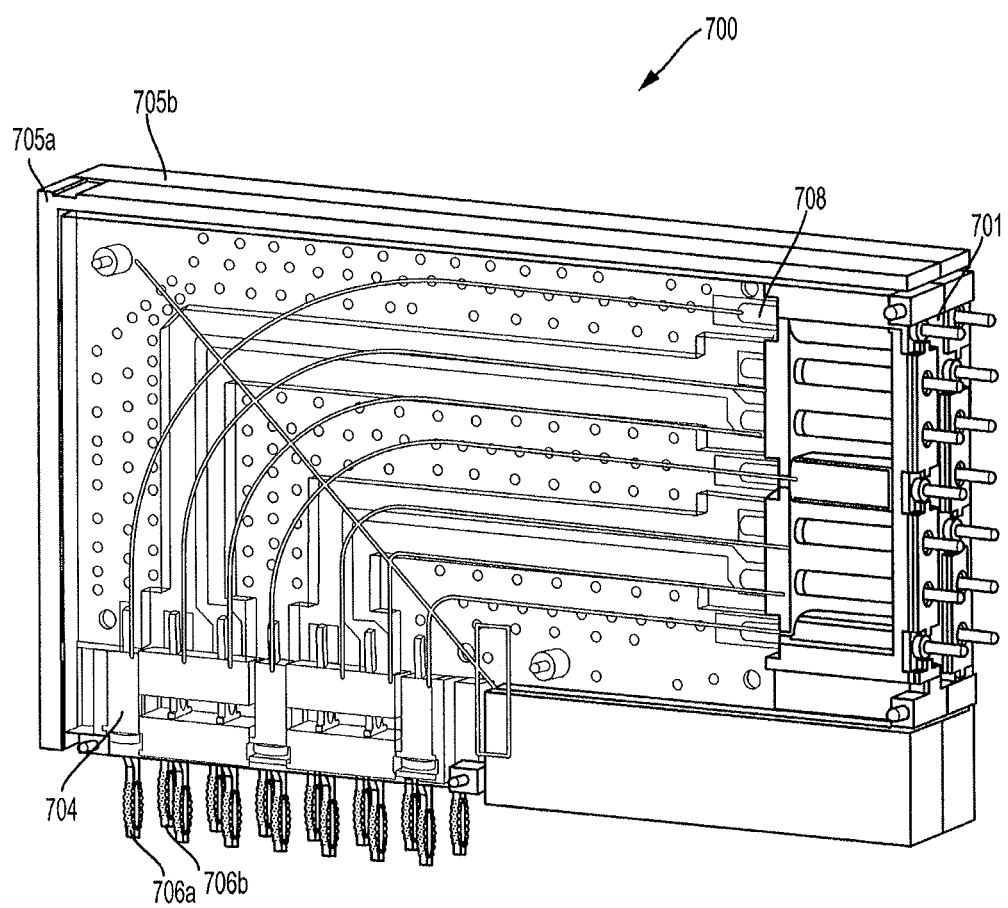
FIG. 7 shows a modular connector assembly having multiple printed circuit boards in the spring probe connector device according to an aspect of the invention.

FIG. 7 shows a modular connector assembly 700 having a first printed circuit board 705a and a second printed circuit board 705b.

The modular connector assembly 700 includes a first printed circuit board 705a and a second printed circuit board 705b, a first plurality of compliant pin clips 706a, a second plurality of complaint pin clips 706b, and a plurality of spring probe connectors 701. The first printed circuit board 705a and the second printed circuit board 705b may be configured similarly as the printed circuit boards 405, 505, and 605 discussed in regard to FIGS. 4, 5, and 6 and may include similar features as the printed circuit boards 405, 505, and 605 discussed in regard to FIGS. 4, 5, and 6. The plurality of spring probe connector 701 may be configured similarly as the spring probe connectors 100, 200, and 601 discussed in regard to FIGS. 1A-1B, 2A-2B, 3A-C, 4, 5, and 6 and may include similar features as the spring probe connectors 100, 200, and 601 discussed in regard to FIGS. 1A-1B, 2A-2B, 3A-C, 4, 5, and 6.

The first plurality of compliant pin clips 706a and the second plurality of compliant pin clips 706b may be configured similarly as the plurality of complaint pin clips 506 and 606 discussed in regard to FIGS. 5 and 6A-6C and may include similar features as the plurality of complaint pin clips 506 and 606 discussed in regard to FIGS. 5 and 6A-6C.

The features of the modular connector assembly 700 may be utilized with any embodiment of the modular connector assembly disclosed herein.

It is to be understood that although aspects of the present specification are highlighted by referring to specific embodiments, one skilled in the art will readily appreciate that these disclosed embodiments are only illustrative of the principles of the subject matter disclosed herein. Therefore, it should be understood that the disclosed subject matter is in no way limited to a particular methodology, protocol, and/or reagent, etc., described herein. As such, various modifications or changes to or alternative configurations of the disclosed subject matter can be made in accordance with the teachings herein without departing from the spirit of the present specification. Lastly, the terminology used herein is for the purpose of describing particular embodiments only, and is not intended to limit the scope of systems, apparatuses, and methods as disclosed herein, which is defined solely by the claims. Accordingly, the systems, apparatuses, and methods are not limited to that precisely as shown and described.

What is claimed is:

1. A spring probe connector that connects to a backplane and a printed circuit board of a modular connector assembly, the spring probe connector comprising:
    a hollow barrel defining a first opening and a second opening;
    a plunger configured to be received by the first opening, the plunger having a contact tip that protrudes from the first opening and is configured to make electrical contact with the backplane;
    one or more springs positioned within the hollow barrel and configured to apply a load onto the plunger; and
    a contact end that protrudes from the second opening and is configured to connect with the printed circuit board of the modular connector assembly, the contact end having a central portion, the central portion having two posterior engagement arms and an anterior engagement arm extending therefrom, the two posterior engagement arms opposing the anterior engagement arm, the two posterior engagement arms being configured to engage with a posterior side of an edge of the printed circuit board and the anterior engagement arm being configured to engage with an anterior side of the edge.

2. The spring probe connector of claim 1, wherein the plunger is configured to retract into the hollow barrel and maintain an electrical connection with the backplane when a force is applied onto the plunger.

3. The spring probe connector of claim 2, wherein the first opening is positioned opposite the second opening, the first opening and the second opening being aligned along a longitudinal axis.

4. The spring probe connector of claim 3, wherein the plunger and the contact end extend along the longitudinal axis.

5. The spring probe connector of claim 1, wherein the two posterior engagement arms and the anterior engagement arm include inwardly facing curved portions configured to contact the edge of the printed circuit board.

6. The spring probe connector of claim 5, wherein the two posterior engagement arms and the anterior engagement arm each have an S-shape.

7. The spring probe connector of claim 1, wherein the anterior engagement arm is aligned with a space between the two posterior engagement arms to offset each of the two posterior engagement arms.

8. The spring probe connector of claim 1, wherein the two posterior engagement arms or the anterior engagement arm [s] is spring biased.

9. A spring probe connector device for a modular connector assembly that connects to a backplane, the spring probe connector device comprising:
a carrier for providing an interface to the backplane and configured to hold an array of a plurality of spring probes, each spring probe of the plurality of spring probes being configured to retract and maintain an electrical connection with the backplane when a force is applied, each of the plurality of spring probes comprising:
a hollow barrel insertable into the carrier, the hollow barrel defining a first opening and a second opening;
a plunger configured to be received by the first opening, the plunger having a contact tip that protrudes from the first opening and configured to make electrical contact with the backplane;
one or more springs positioned within the hollow barrel and configured to apply a load onto the plunger; and
a contact end that protrudes from the second opening and is configured to connect with the printed circuit board of the modular connector assembly, the contact end having one or more posterior engagement arms and one or more anterior engagement arms, the one or more posterior engagement arms being configured to engage with a posterior edge of the printed circuit board and the one or more anterior engagement arms being configured to engage with an anterior edge of the printed circuit board.

10. The spring probe connector device of claim 9, wherein the plurality of spring probes are arranged in an array along an edge of a printed circuit board.

11. The spring probe connector of claim 9, wherein the one or more posterior engagement arms and the one or more anterior engagement arms include inwardly facing curved portions configured to contact the edge of the printed circuit board.

12. The spring probe connector of claim 11, wherein at least one of the one or more posterior engagement arms or the one or more anterior engagement arms are spring biased.

13. The spring probe connector of claim 12, wherein the one or more posterior engagement arms comprise two posterior engagement arms and the one or more anterior engagement arms comprise one anterior engagement arm.

14. A modular card assembly that interconnects with a backplane, the modular card assembly comprising:
a spring probe connector device having a first plurality of spring probes that are each configured to retract and maintain an electrical connection with the backplane when a force is applied, each of the first plurality of spring probes comprising:
a hollow barrel defining a first opening and a second opening;
a plunger configured to be received by the first opening, the plunger having a contact tip that protrudes from the first opening and is configured to make electrical contact with the backplane;
one or more springs positioned within the hollow barrel and configured to apply a load onto the plunger; and
a contact end that protrudes from the second opening;
a plurality of compliant pin clips, a second plurality of spring probes, or a solder tail; and
a printed circuit board having one or more traces that connect the spring probe connector device by the contact end of each of the first plurality of spring probes to the plurality of compliant pin clips, the second plurality of spring probes, or the solder tail that are configured to electrically connect with another printed circuit board.

15. The modular card assembly of claim 14, further comprising a plastic holder that is configured to receive and hold the plurality of compliant pin clips, the second plurality of spring probes, or the solder tail.

16. The modular card assembly of claim 14, wherein each spring probe within the first plurality of spring probes corresponds to a compliant pin clip within the plurality of compliant pin clips, a spring probe within the second plurality of spring probes, or the solder tail.

17. The modular card assembly of claim 15, wherein each compliant pin clip within the plurality of compliant pin clips is an eye of the needle press-fit compliant pin that is configured to collapse when pushed or moved into a printed circuit board hole.

* * * * *